United States Patent [19]
Linder

[11] Patent Number: 6,157,224
[45] Date of Patent: Dec. 5, 2000

[54] HIGH SPEED PIN DRIVER INTEGRATED CIRCUIT ARCHITECTURE FOR COMMERCIAL AUTOMATIC TEST EQUIPMENT APPLICATIONS

[75] Inventor: Lloyd F. Linder, Agoura Hills, Calif.

[73] Assignee: Raytheon Company, Lexington, Mass.

[21] Appl. No.: 09/219,759

[22] Filed: Dec. 23, 1998

[51] Int. Cl.[7] .................................................. H03B 1/00
[52] U.S. Cl. ........................................... 327/108; 327/478
[58] Field of Search .................................... 327/108, 103, 327/355, 361, 334, 350, 352, 53, 66, 65, 374, 478

[56] References Cited

U.S. PATENT DOCUMENTS

| | | | |
|---|---|---|---|
| 4,251,742 | 2/1981 | Beelitz | 326/91 |
| 4,800,294 | 1/1989 | Taylor | 327/109 |
| 5,146,159 | 9/1992 | Lau et al. . | |
| 5,179,293 | 1/1993 | Hilton | 327/480 |
| 5,302,859 | 4/1994 | Whitney . | |
| 5,357,211 | 10/1994 | Bryson et al. | 330/263 |
| 5,377,202 | 12/1994 | Lee et al. . | |
| 5,699,001 | 12/1997 | Awaji et al. | 327/112 |

*Primary Examiner*—Timothy P. Callahan
*Assistant Examiner*—Hai L. Nguyen
*Attorney, Agent, or Firm*—Leonard A. Alkov; Glenn H. Lenzen, Jr.

[57] ABSTRACT

An improved high speed PIN driver integrated circuit and architecture. The architecture of the PIN driver circuit does not rely on transistor clamping during normal operation in active mode, and does not require high reverse base-emitter breakdown voltage in inhibit mode or the active mode, which is in direct opposition to high speed performance at high PIN voltage excursions for CMOS, TTL, ECL level compatibility. In particular, the PIN driver circuit is always an active linear circuit and does always protects the reverse base-emitter voltage of any transistor and does not require wire-OR or clamp transistors. The architecture uses replica biasing to cancel the current of the PIN driver in the inhibit mode, which is a requirement for automatic test equipment where the leakage current produces at the PIN in the inhibit mode is not calibrated out. The replica biasing is implemented using a current mirror circuit, a summing device and a buffer circuit which generates the voltage replica in an active mode of the PIN driver circuit. The replica biasing scheme used in the present invention tracks over temperature and process, and provides for improved high speed circuitry without the need for calibration of leakage currents in the inhibit mode.

10 Claims, 5 Drawing Sheets

HIGH SPEED PIN DRIVER INTEGRATED CIRCUIT ARCHITECTURE FOR COMMERCIAL AUTOMATIC TEST EQUIPMENT APPLICATIONS

BACKGROUND

The present invention relates generally to PIN driver integrated circuits, and more particularly, to a high speed PIN driver integrated circuit architecture that is suitable for commercial automatic test equipment (ATE) applications to test CMOS, TTL, ECL, low level differential interfaces, such as differential field effect transistor (DFET) GaAs interfaces, and low level CMOS (LVCMOS) interfaces, for example, at very high speeds.

Commercial automatic test equipment systems, such as digital testers, and the like, typically use 500–600 PIN driver circuits per test head, and several test heads per system. Prior art PIN drivers include those developed by such manufacturers as Elantec, Inc., Analog Devices, Inc. and Harris Semiconductor, Inc. for example. The Elantec, Inc. architecture was disclosed at the IEEE 1992 Bipolar Circuits and Technology Meeting. The Analog Devices PIN driver architecture is disclosed in U.S. Pat. No. 5,179,293. The Harris Semiconductor, Inc. architecture was also disclosed in a paper given at the IEEE 1992 Bipolar Circuits and Technology Meeting.

The Elantec, Inc. architecture with a process that can withstand large reverse-bias on the base-emitter junction of the devices. As a result, the achievable performance of this device is in the 25–50 MHz range. The present invention was developed to test SRAM devices operating at greater than or equal to 600 MHz based on the use of a RAMBUS architecture, and therefore the architecture used in the Elantec, Inc. device cannot be implemented in a high speed integrated circuit. This is a direct result of the trade-off between high reverse breakdown and high speed operation for a device.

The Analog Devices PIN driver architecture is disclosed in U.S. Pat. No. 5,179,293. In the Analog Devices driver, as is shown in the figure on the cover page of U.S. Pat. No. 5,179,293, transistors Q40, Q54, Q50 and Q51 rely on clamping action that has been previously described. The clamping approach results in slow response times. Also, the clamping approach of U.S. Pat. No. 5,179,293 suffers from the reverse base-emitter breakdown voltage problem previously described. Resistors have been added to this circuit in an attempt to current-limit the resulting leakage and help with the breakdown problem, but the resistors are very small due to the large switching currents. Also the bias cancellation scheme relies on beta matching to cancel the inhibit mode bias current. The present invention uses a replica bias to obtain improved input current cancellation.

The approach taken by Harris Semiconductor, Inc. is to try to solve the problem with reverse base-emitter breakdown. This can be seen with reference to FIG. 2 of the Harris paper and in particular transistors Qod3*a*, QC3, Qod3*b* shown in FIG. 2. What Harris is trying to do is distribute the worst case 9 Volt reverse bias voltage across three base-emitter junctions. The problem is that there is no guarantee that this voltage will distribute evenly, and thus there will be reverse leakage currents that result which poses reliability problems, degrades the forward characteristics of the device and supplies unacceptable PIN leakage currents when the circuit operates in Inhibit mode.

In order to develop a commercial PIN driver integrated circuit, a unique solution must be provided that overcomes the limitations of the prior art. This unique solution also must outperform available prior art drivers in order to allow the product to be a commercial success. As a result, the inherent limitations of prior art PIN driver architectures must be overcome. This includes reverse base-emitter breakdown and input PIN leakage current during Inhibit mode while at the same time allowing for a high speed process to be used to allow for high frequency operation. The present invention provides for such an PIN driver integrated circuit architecture.

It would therefore be desirable to have a high speed PIN driver integrated circuit architecture that overcomes the limitations of prior art approaches. Accordingly, it is an objective of the present invention to provide for an improved high speed PIN driver integrated circuit architecture adapted for commercial automatic test equipment applications. It is another objective of the present invention to provide for an improved high speed PIN driver integrated circuit architecture that may be used to test CMOS, TTL, ECL, low level differential, and LVCMOS interfaces at very high speeds.

SUMMARY OF THE INVENTION

To accomplish the above and other objectives, the present invention provides for an improved high speed PIN driver integrated circuit and architecture that overcome the limitations of prior art PIN driver circuits. The architecture of the PIN driver circuit has a current mirror circuit comprising low and high current generators. Outputs of the current generators are summed in a summing device which generates a voltage replica at a in an active mode of the PIN driver circuit. A mode switch interconnects an active buffer and an inhibit buffer between the summing device and a PIN circuit. The mode switch couples the voltage replica formed at the resistor to the PIN circuit in the active mode of the PIN driver circuit. The current outputs of the summing device and inhibit buffer are coupled to a third switch whose output is coupled to an active/inhibit current generator.

The low and high current generators produce current that generates a voltage replica (a voltage replica of the $V_H$ or $V_L$ (high voltage or low voltage) at the resistor in the active mode of the PIN driver circuit, and which drives the PIN circuit through the active buffer. The active/inhibit current generator produces an offset current in active mode of the PIN driver circuit at the summing device, and powers the inhibit buffer in the inhibit mode of the PIN driver circuit. The architecture relies on collector-base breakdown, as opposed to base-emitter breakdown, thus making it a unique PIN driver circuit. This allows higher frequency technologies to be used for high speed pin driver circuits without suffering the limitations of reverse emitter-base breakdown.

The architecture of the high speed PIN driver integrated circuit does not rely on transistor clamping during normal operation. A linear version of $V_H$ or $V_L$ is produced at a summing node. Clamps are slow to turn on and off to provide for high speed operation. The present architecture does not require high reverse base-emitter breakdown voltage which is in direct opposition to high speed performance. The present architecture uses replica biasing to cancel the input current of the PIN driver in inhibit mode. The replica biasing scheme used in the present invention tracks over temperature and process, and provides an improved scheme over the prior art.

In the prior art approaches, the output levels are generated either (1) through clamping action which is slow, or (2) through a wire-OR connection, which produces serious reverse base-emitter breakdown, resulting in large leakage currents, degraded performance in normal active mode, and compromised long term reliability, or (3) with a process that can handle the reverse base-emitter voltage swings which, by default, requires a slow integrated circuit process. The architecture of the PIN driver circuit is novel in that it is always an active linear circuit and does not rely on transistor clamping during normal operation in active mode. The architecture of the PIN driver circuit also does not require high reverse base-emitter breakdown voltage in inhibit mode or active mode, which is in direct opposition to high speed performance at high PIN voltage excursions for CMOS, TTL, ECL level compatibility. The result is a very fast PIN driver architecture and circuit.

The present invention was developed to provide a commercial standard integrated circuit product for the automatic test equipment applications. The basic concept of the present invention was developed to provide a unique solution for this application that solves the limitations of prior art approaches mentioned above.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which.

DETAILED DESCRIPTION

Figure 1:
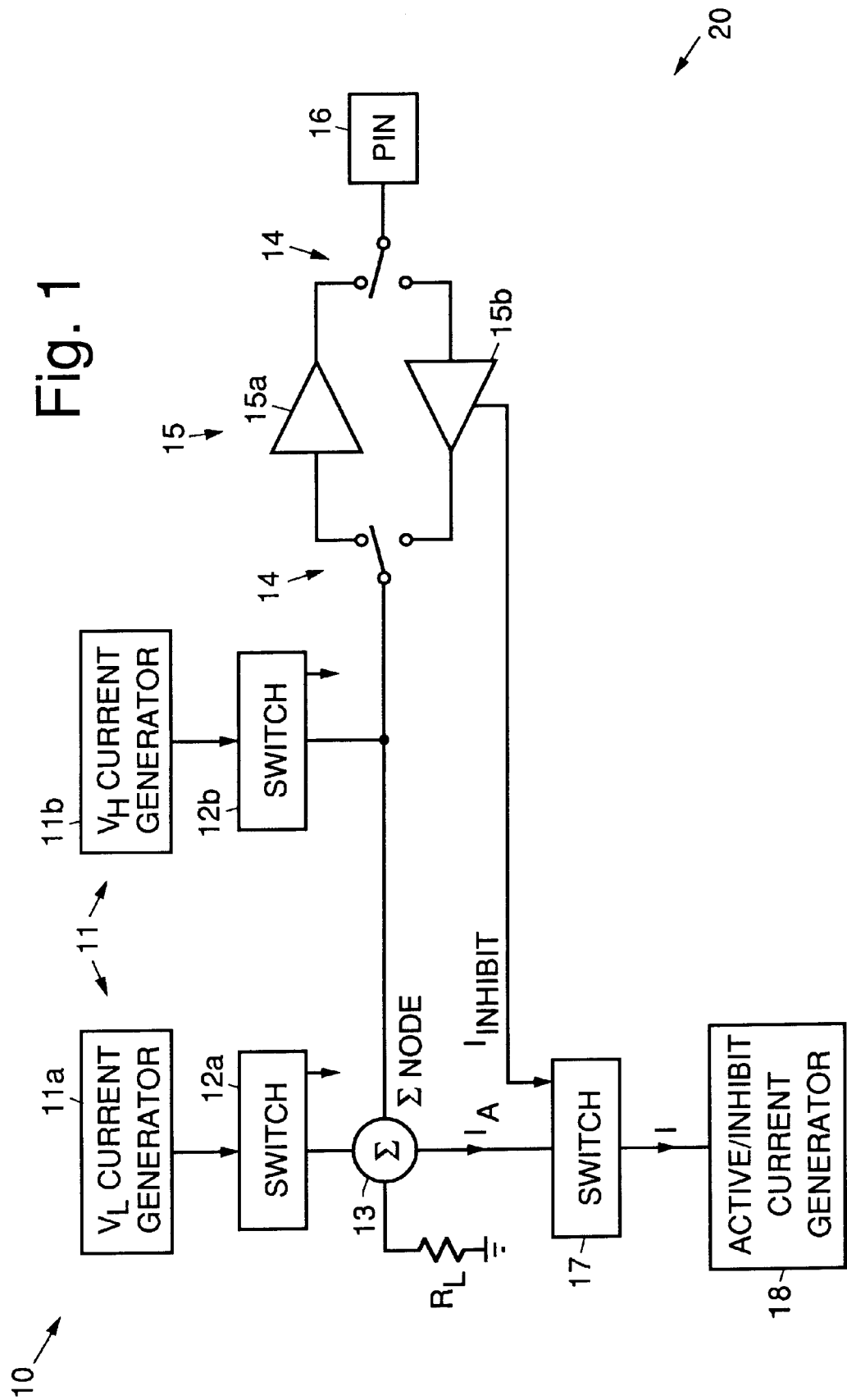
FIG. 1 is a simplified block diagram that illustrates an architecture of a PIN driver circuit in accordance with the principles of the present invention.

Referring to the drawing figures, FIG. 1 is a simplified block diagram that illustrates an architecture 10 of a PIN driver circuit 20 in accordance with the principles of the present invention. The architecture 10 of the PIN driver circuit 20 comprises low ($V_{low}$ or $V_L$) and high ($V_{high}$ or $V_H$) current generators 11a, 11b that form a current mirror circuit 11. The low and high current generators 11a, 11b are coupled to first and second switches 12a, 12b. Outputs of the first and second switches 12a, 12b are combined in a summing device 13 (or Σ-node 13) which generates a voltage replica at a resistor $R_L$ coupled to the summing device 13 in an active mode of the PIN driver circuit 20.

The output of the second switch 12b is also coupled to a mode switch 14 whose outputs are coupled to an active buffer 15a and an inhibit buffer 15b. The mode switch 14 operates to couple the voltage replica formed at $R_L$ to the PIN circuit 16 in the active mode of the PIN driver circuit 20.

The current output $I_A$ of the summing device 13 is coupled to a first input of a third switch 17. A current output $I_{INH}$ of the inhibit buffer 15b is coupled to a second input of the third switch 17. An output of the third switch 17 is coupled to an active/inhibit current generator 18.

In operation, the $V_L$ and $V_H$ current generators produce a current that generates a voltage replica at $R_L$ in the active mode of the PIN driver circuit 20, that drives the PIN circuit 16 through the active buffer 15a. The active/inhibit current generator 18 produces an offset current in active mode of the PIN driver circuit 20 at the summing device 13 (or Σ-node 13), and powers the inhibit buffer 15b in the inhibit mode of the PIN driver circuit 20. Due to the fact that the architecture 10 relies on collector-base breakdown, as opposed to base-emitter breakdown, the generic architecture 10 of the PIN driver circuit 20 is also unique.

Figure 2:
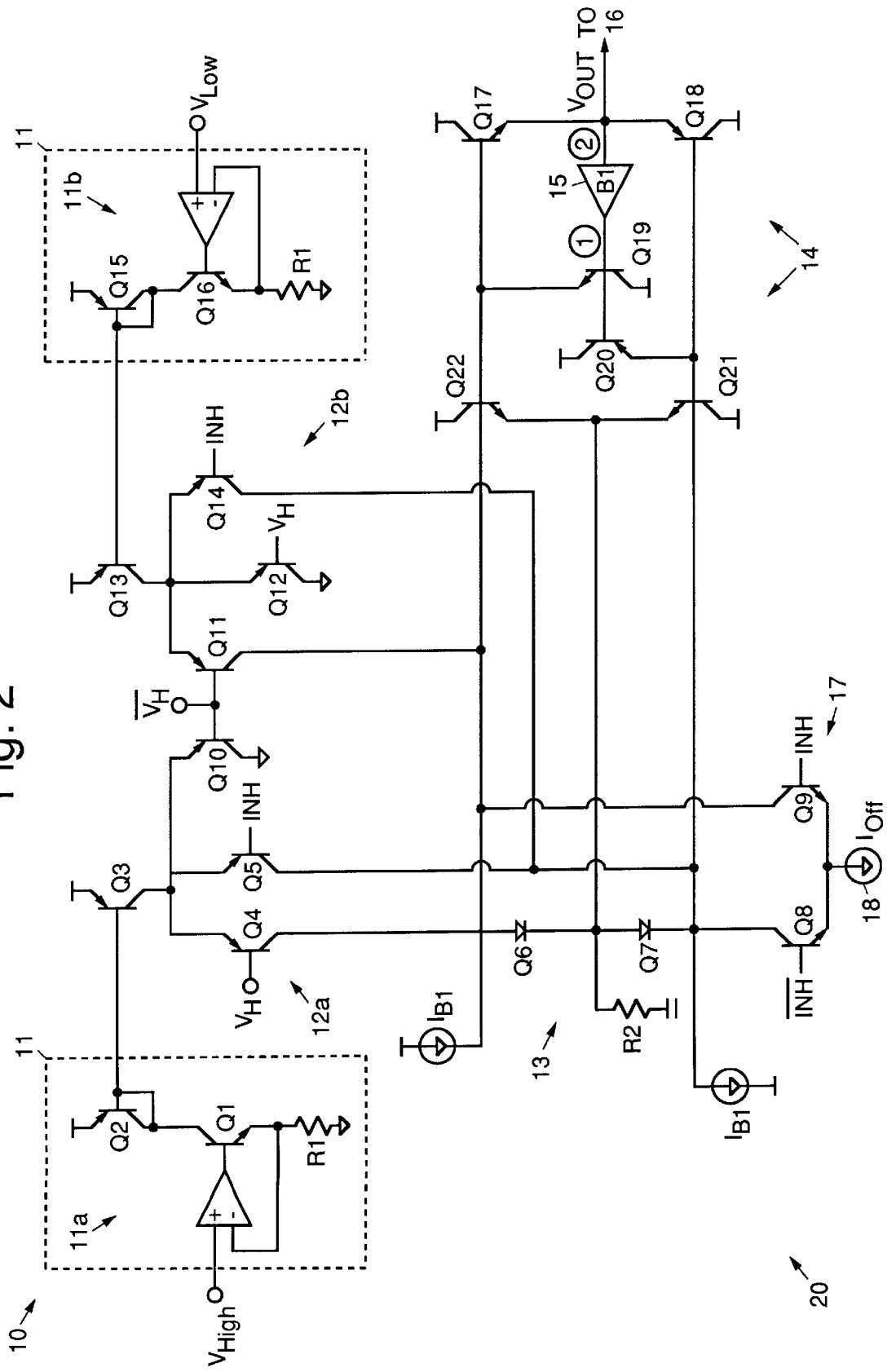
FIG. 2 illustrates details of the PIN driver architecture shown in FIG. 1.

FIG. 2 illustrates details of the architecture 10 of the PIN driver circuit 20 of FIG. 1. The basic idea implemented in the PIN driver architecture 10 is to transfer $V_{high}$ or $V_{low}$ to the output. The simple architecture 10 shown in FIG. 1 has many novel features that will be explained below. Also, the voltage levels of $V_{high}$ and $V_{low}$ must be able to swing +5/−2 Volts, which is why a biasing scheme is employed as is shown in FIG. 2. As was discussed in the Background section, prior art approaches suffer reverse-base-emitter problems when dealing with this voltage-swing requirement. The present architecture 10 gets around this issue. Furthermore, it is to be understood that the architecture 10 may alternatively be implemented using NPN switches in place of PNP switches, and PNP switches in place of the NPN switches used in the exemplary embodiment of the present invention.

Figure 3:
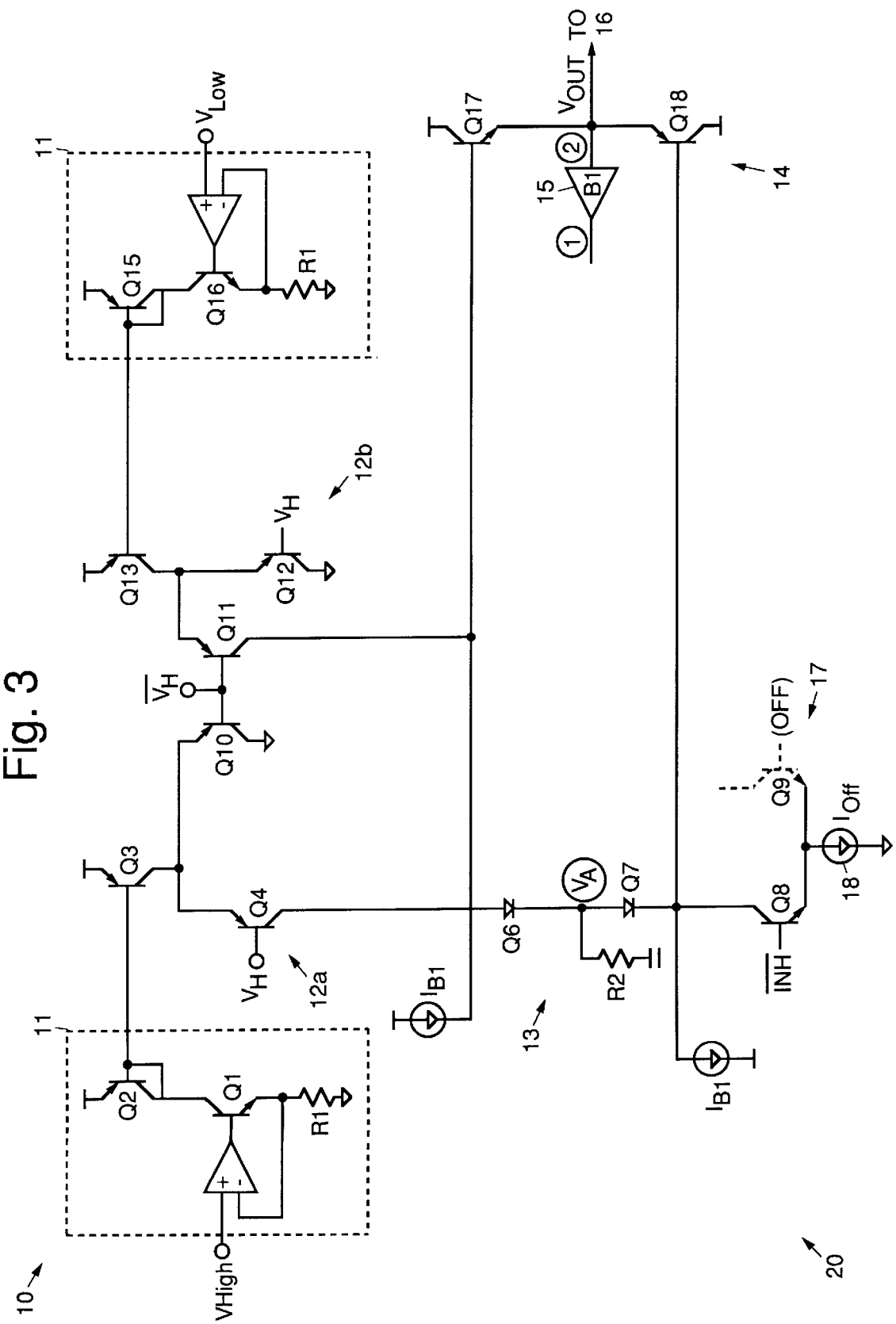
FIG. 3 illustrates the structure of the PIN driver architecture of FIG. 2 during normal operation.

FIG. 3 illustrates the structure of the PIN driver architecture 10 of FIG. 2 during normal operation. During normal operation, transistors Q9, Q20, Q21, Q22, Q14 and Q5 are off, and transistor Q8 is on. For $V_{out}=V_{high}$, transistor Q4 is on, transistor Q11 is off, transistor Q12 is on and transistor Q10 is off, $V_A$ goes high and $V_{out}$ follows. For $V_{out}=V_{low}$, transistor Q4 is off, transistor Q11 is on, transistor Q12 is off and transistor Q10 is on, $V_A$ goes low and $V_{out}$ follows.

The key advantage of this architecture over previous designs is that the reverse base-emitter voltage breakdown does not affect operation of the PIN driver circuit 20. During inhibit mode, the concern is collector-base breakdown, not base-emitter voltage breakdown. This key feature allows higher frequency complementary bipolar technologies to be used to produce the PIN driver circuit 20 without suffering the side effects of lower base-emitter breakdown, thereby increasing the frequency of operation.

Figure 4:
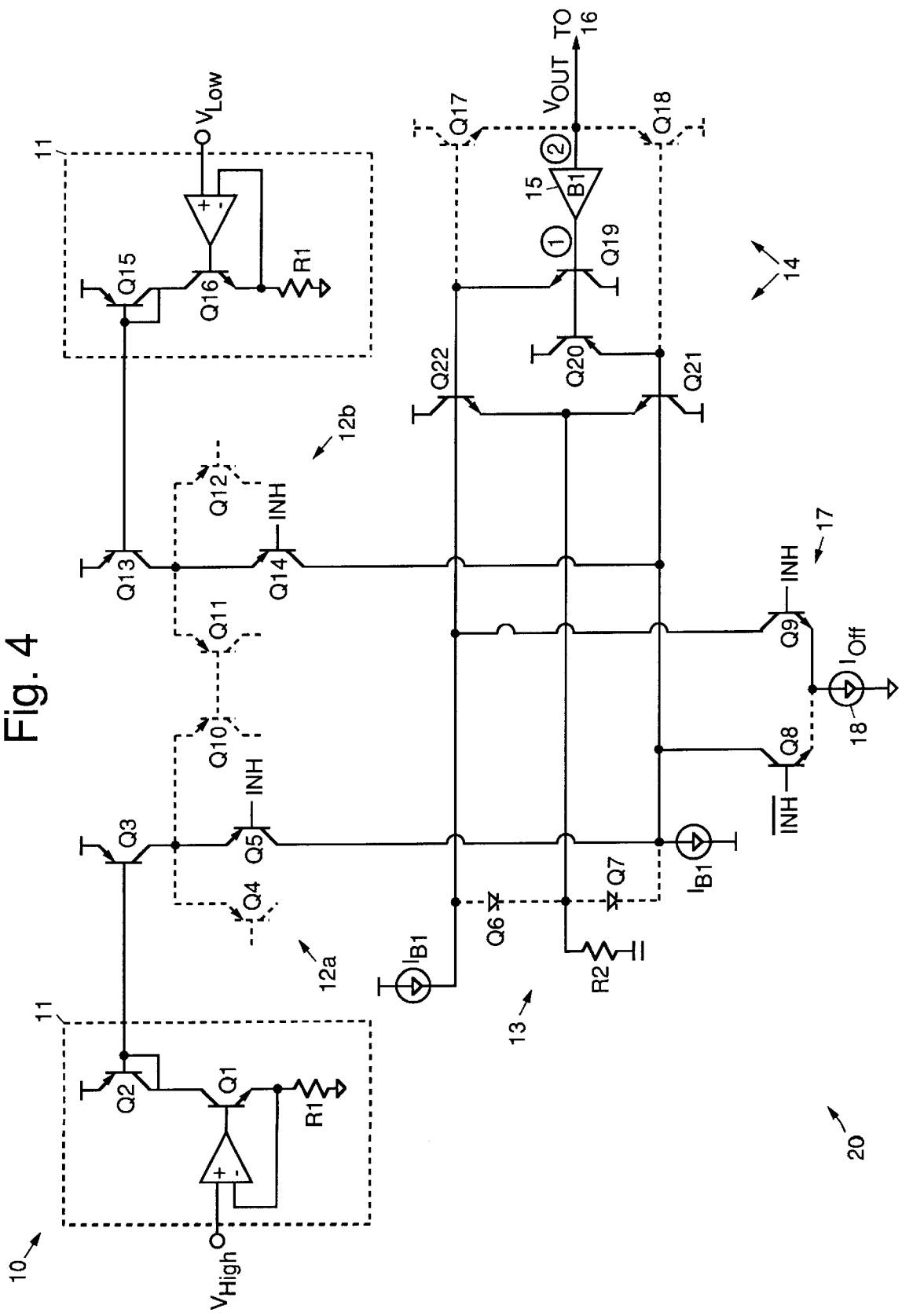
FIG. 4 illustrates the structure of the PIN driver architecture of FIG. 2 during inhibit mode.

FIG. 4 illustrates the structure of the PIN driver architecture 10 of FIG. 2 during inhibit mode. During inhibit mode, transistors Q4, Q10, Q6, Q7, Q11, Q12, Q17, Q18, and Q8 are off. Transistors Q6, Q7, Q17, and Q18 are off and are bootstrapped with respect to the $V_{out}$ signal in inhibit mode. Because of the bootstrapping, the reverse base-emitter voltages are fixed over the voltage signal swing.

In inhibit mode, transistors Q19–Q22 bootstrap the circuit so that the reverse base-emitter voltage (2–3 volts) is not an issue and is replaced by collector-base breakdown voltage (12–15 volts). Current gain can be placed in the transistor mirror circuit (transistors Q2, Q3, and transistors Q13, Q15) to save power. Devices Q6 and Q7 are on in the active mode only. In the inhibit mode, transistors Q6 and Q7 are reverse-biased one diode drop, and are bootstrapped with respect to the voltage drop at the PIN circuit 16, and the PIN driver circuit 20 functions as a linear circuit in normal active mode. All the limitations of the prior art architectures are overcome when using the PIN driver architecture 10 and circuit 20. The speed of the PIN driver architecture 10 also increases by increasing the power of the PIN driver circuit 20. This is not the case with prior art architectures due to the previously described limitations.

During normal operation, transistors Q19 and Q20 in FIG. 1 are bootstrapped, and are reverse-biased by only one base-emitter voltage drop, so this is very safe voltage for high speed integrated circuit manufacturing processes to handle.

Figure 5:
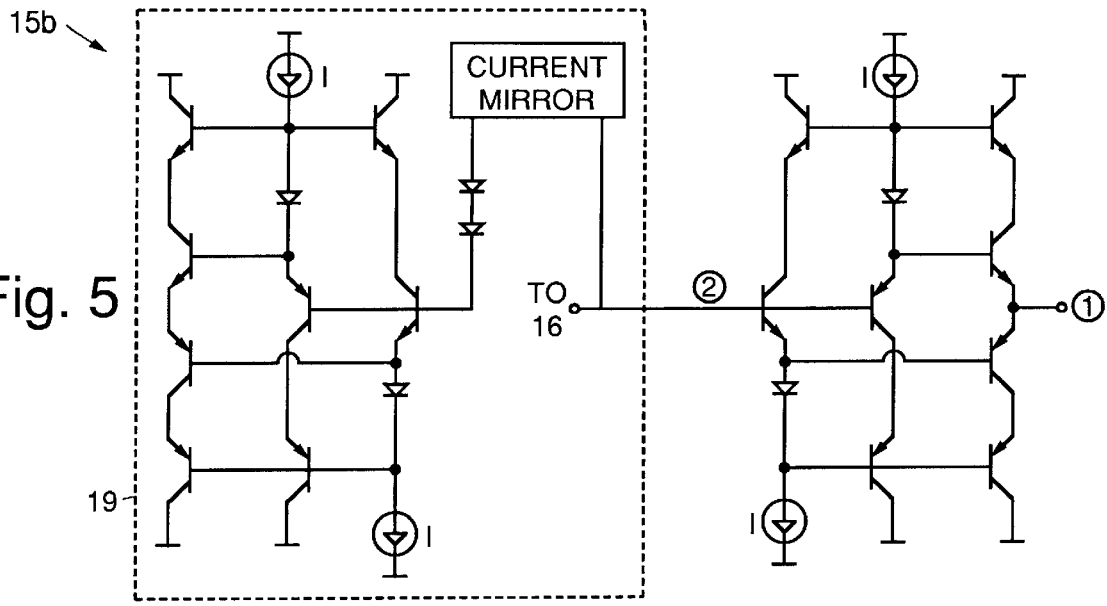
FIG. 5 illustrates a first embodiment of a buffer circuit used in the PIN driver circuit of the present architecture.
Figure 6:
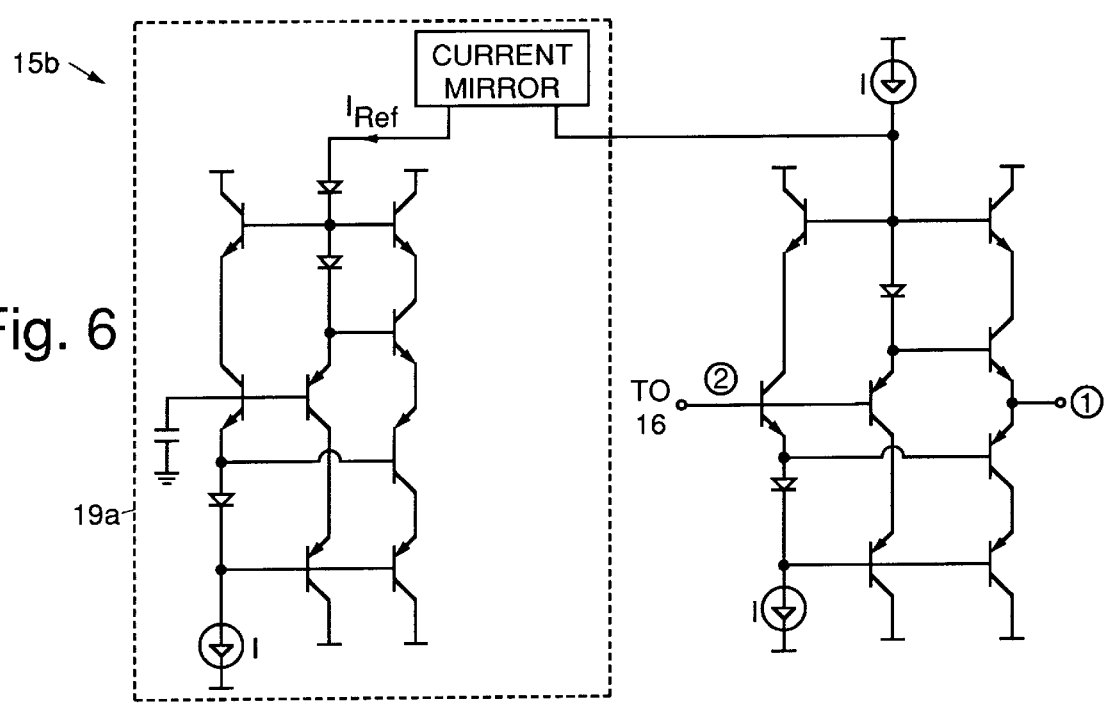
FIG. 6 illustrates a second embodiment of a buffer circuit used in the PIN driver circuit of the present architecture.

The B1 buffer circuit 15 with input bias current cancellation has two exemplary representative implementations, as are shown in FIGS. 5 and 6. FIG. 5 illustrates a first embodiment of the buffer circuit 15 used in the PIN driver circuit 20 that implements the present architecture 10. The first embodiment of the buffer circuit 15 comprises a bias circuit 19 coupled to the inhibit buffer 15b. FIG. 6 illustrates a second embodiment of the buffer circuit 15 used in the PIN driver circuit 20 that implements the present architecture 10. The second embodiment of the buffer circuit 15 comprises an alternative bias circuit 19a coupled to the inhibit buffer 15b.

In the first architecture of the buffer circuit 15, a replica of the input bias current is generated which is mirrored at the input of the buffer circuit 15 (which is coupled to the PIN driver 16) and which cancels the bias current generated at the input of the buffer circuit 15. The second architecture for the buffer circuit 15 provides a current that deals with alpha errors in the buffer circuit 15. The structure of the two buffer circuit architectures provides optimum performance in terms of DC and transient performance and selection of one of the architectures is a function of the application in which the PIN driver architecture 10 is used.

Figure 7:
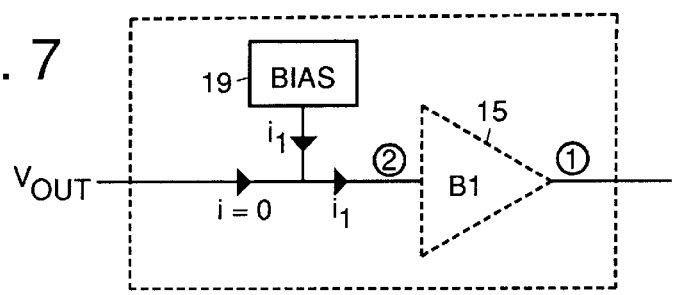
FIG. 7 illustrates the generic structure of the bias circuit shown in FIGS. 5 and 6.

FIG. 7 illustrates the generic structure of the buffer circuit 15 shown in FIGS. 5 and 6. The bias circuit 19 provides an $i_1$ current to the input of the buffer circuit 15, in terms of bias current, so that the overall input bias is zero. The replica bias tries to make the input current of the buffer circuit 15 equal to zero so that there is no leakage current in the inhibit mode.

Thus, a high speed PIN driver integrated circuit architecture and circuit that may be used in commercial automatic test equipment applications has been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. An architecture for a PIN driver circuit comprising:
   a PIN circuit;
   low and high current generators that form a circuit;
   first and second switches coupled to outputs of the low and high current generators;
   a summing device coupled to outputs of the first and second switches and coupled to a resistor, and wherein a voltage replica is generated at the resistor in an active mode of the PIN driver circuit;
   an active buffer and an inhibit buffer;
   a mode switch coupled to the second switch, the summing device, the active buffer and the inhibit buffer that operates to couple the voltage replica formed at the resistor to the PIN circuit in the active mode of the PIN driver circuit;
   a third switch having inputs coupled to a current output of the summing device and a current output of the inhibit buffer; and
   an active/inhibit current generator coupled to an output of the third switch that produces an offset current circuit at the summing device in the active mode of the PIN driver circuit, and powers the inhibit buffer in the inhibit mode of the PIN driver circuit.

2. The architecture recited in claim 1 wherein the summing device, the mode switch, the active buffer and the inhibit buffer create a base-emitter reverse bias that is no greater that one diode drop in either the active or inhibit modes of the PIN driver circuit.

3. The architecture recited in claim 1 some of whose components are constructed using complementary metal-oxide-semiconductor (CMOS) transistors.

4. The architecture recited in claim 1 some of whose components are constructed using complementary gallium arsenide (GaAs) transistors.

5. The architecture recited in claim 1 some of whose components are constructed using transistor-transistor logic (TTL) circuits.

6. The architecture recited in claim 1 some of whose components are constructed using emitter coupled logic (ECL) circuits.

7. The architecture recited in claim 1 some of whose components are constructed using bipolar logic circuits.

8. The architecture recited in claim 1 some of whose components are constructed using differential field effect transistor (DFET) gallium arsenide (GaAs) transistors.

9. The architecture recited in claim 1 wherein the bias cancellation circuitry for the PIN circuit has very low inhibit mode current leakage .

10. The architecture recited in claim 1 wherein in active mode, a linear versions of high and low voltages are generated by the current mirror circuit at the PIN circuit.

* * * * *